United States Patent [19]

Putnam

[11] Patent Number: 4,556,145
[45] Date of Patent: Dec. 3, 1985

[54] ONE PIECE FLATPACK CHIP CARRIER

[75] Inventor: Duane Putnam, Blaine, Minn.

[73] Assignee: Control Data Corporation, Minneapolis, Minn.

[21] Appl. No.: 717,057

[22] Filed: Mar. 28, 1985

[51] Int. Cl.[4] .................. B65D 73/02; B65D 85/42
[52] U.S. Cl. ............................. 206/329; 206/331; 206/560
[58] Field of Search ............... 206/329, 331, 332, 334, 206/560, 562, 563, 564

[56] References Cited

U.S. PATENT DOCUMENTS

| | | | |
|---|---|---|---|
| 3,826,377 | 7/1974 | Bachmann | 206/328 |
| 4,026,412 | 5/1977 | Henson | 206/331 |
| 4,329,642 | 5/1982 | Luthi et al. | 206/328 |
| 4,379,505 | 4/1983 | Alemanni | 206/329 |
| 4,483,441 | 11/1984 | Akizawa et al. | 206/328 |

Primary Examiner—Joseph Man-Fu Moy
Attorney, Agent, or Firm—E. P. Heller, III; J. A. Genovese

[57] ABSTRACT

A one piece carrier for flatpack chips capable of accommodating chips of varying size. The carrier includes a pair of cantilever arms each having a tapered head for holding chips of varying thicknesses. The arms extend into the carrier's central aperture, one from the top and one from the bottom side of the aperture. Longitudinally offset stops are mounted on the arms to both laterally and longitudinally stabilize a small chip whose length is insufficient to reach the conventional stops mounted on the top and bottom sides of the central aperture. A recess is provided in the lateral sides of the central aperture to accommodate motion of the cantilever arms so that chips of varying widths may be held between the heads of the arms up to the width of the central aperture. A step of lower elevation is formed in the body of the carrier between the lead support channels adjacent the lateral sides of the central aperture to accommodate the formed leads of a chip.

19 Claims, 10 Drawing Figures

U.S. Patent  Dec. 3, 1985  Sheet 1 of 3  4,556,145
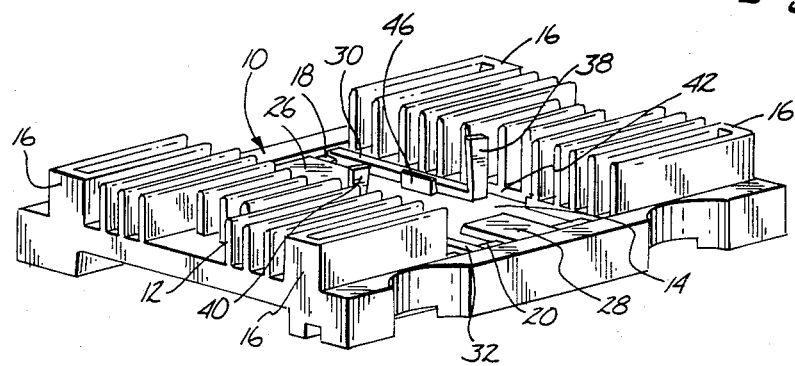
Fig.1
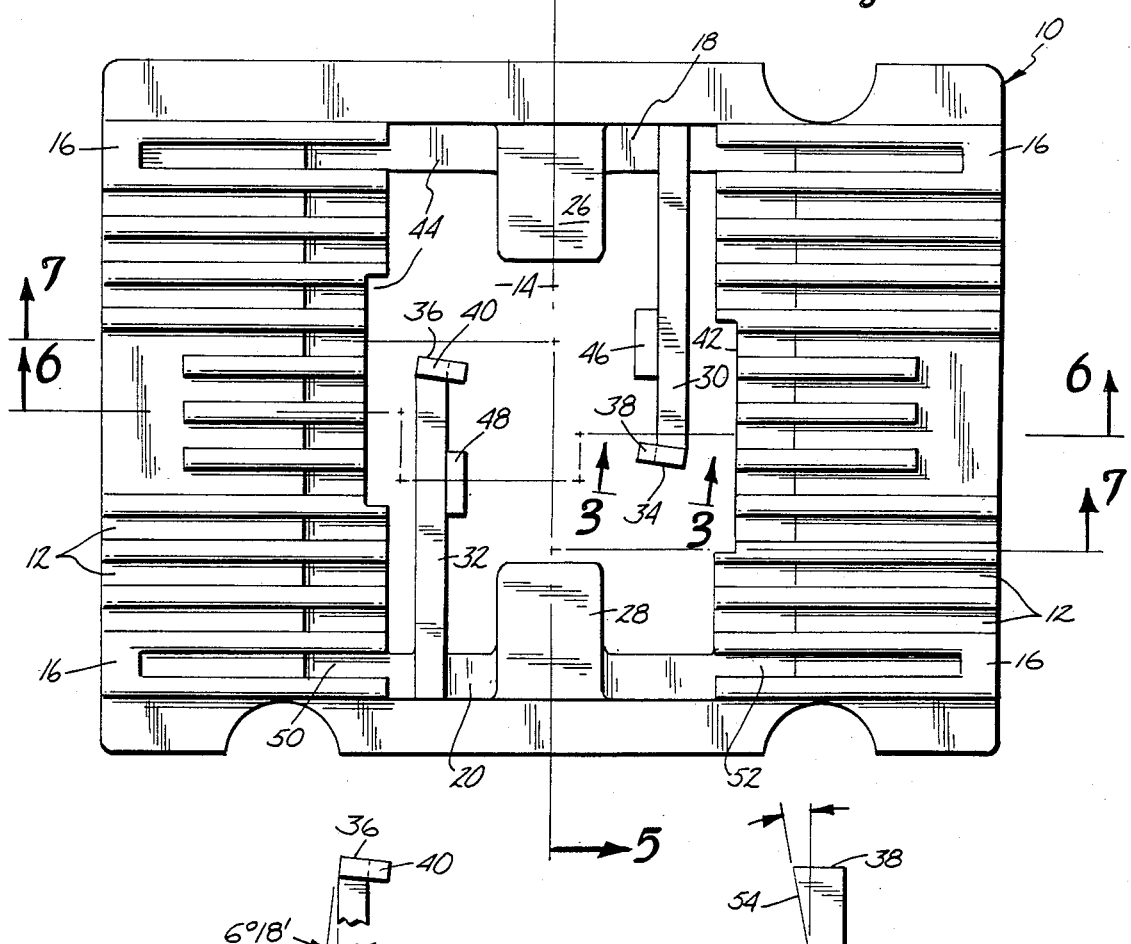
Fig.2
Fig.4
Fig.3

1

ONE PIECE FLATPACK CHIP CARRIER

BACKGROUND OF THE INVENTION

1. Field of the Invention

The invention relates to the field of flatpack integrated chip carriers.

2. Brief Description of the Prior Art

There are many forms of one piece flatpack chip carriers. See e.g., Ralstin U.S. Pat. No. 4,435,724 assigned to Wells Electronics, Inc., Alemanni U.S. Pat. No. 4,379,505 assigned to Gibson-Egan Co., Tems U.S. Pat. No. 3,652,974 assigned to Milcross Control, Inc. (aka Milton Ross), Barnes U.S. Pat. No. 3,529,277, and Suverkropp et al. U.S. Pat. No. 3,471,865 assigned to Signetics Corp. See also Morton, Jr. U.S. Pat. No. 4,444,309 assigned to Bourns, Inc., a leadless chip carrier.

Common to these carriers is a design that is intended to accommodate a specific size chip. However, chips come in many different widths, lengths and thicknesses. Thus they are loaded into many different configuration carriers by their manufactures. These different carrier configurations represent a barrier to automatic assembly operations.

SUMMARY OF THE INVENTION

The invention comprises a one piece carrier suitable for automatic assembly processes which accommodates flatpack chips of varying size. The one piece carrier has a body portion upon which are mounted a plurality of lateral side channels to support the leads of a flatpack chip. A central aperture formed in the body portion has top, bottom and right and left sides. The carrier includes a pair of cantilever arms each having a tapered head for holding a chip. The arms extend into the carrier's central aperture, one from the top and one from the bottom side of the aperture. Longitudinally offset stops are mounted on the arms to both laterally and longitudinally stabalize a small chip whose length is insufficient to reach the conventional stops mounted on the top and bottom sides of the central aperture. A recess is provided in the lateral sides of the central aperture to accommodate motion of the cantilever arms so that chips of varying widths may be held between the heads of the arms up to the width of the central aperture. A step of lower elevation is formed in the body of the carrier between the lead support channels adjacent the lateral sides of the central aperture to accommodate the formed leads of a chip.

BRIEF DESCRIPTION OF THE DRAWINGS

FIG. 1 shows a perspecitive view of the one piece flatpack chip carrier according to the present invention.

FIG. 2 shows a top plan view of the one piece flatpack carrier.

FIG. 3 is a view along 3—3 of FIG. 2.

FIG. 4 is a detail of one of the tapered heads of FIG. 2 showing the inclination of the head.

DESCRIPTION OF THE PREFERRED EMBODIMENTS

Figure 5:
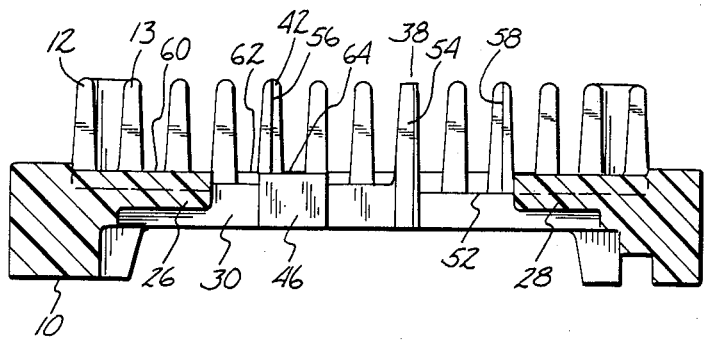
FIG. 5 is a cross-sectional view along 5—5 of FIG. 2.

FIG. 1 shows a perspective view of the preferred embodiment of the present invention. It is comprised of a body portion 10 having mounted thereon a series of lateral channels 12 extending from a central aperture 14 for supporting the leads of a flatpack chip (not shown). The outer ends of the four outer channels have closing walls 16 which permit the carriers to be stacked and slid relative to one another without the channels becoming stuck. (In most standard carriers, the underside of the carrier has a grove adjacent one side into which the narrow wall of a channel can fit and become stuck.)

The central aperture has four sides: top 18, bottom 20, left 22 and right 24. Mounted on the top side and extending into the aperture is a stop 26. Mounted on the bottom side is a similar stop 28. These two stops provide longitudinal support for most chips. Support for short chips will be discussed momentarily. Also mounted on the top side of the central aperture and spaced from the center of the side by a predetemined distance is a resilient cantilever arm 30. A similar arm 32 is mounted on the bottom side a space an equal an opposite distance from the center of the bottom side. Each arm extends into the central aperture a distance sufficient for its second end (34 and 36) to lie beyond the centerline between the centers of the left and right sides of the central aperture. Mounted on these arm ends are tapered heads 38 and 40. Preferably, the ends 34 and 36 of the cantilever arms are aligned with the wall of a channel so that the tpaered heads do not to interfere with the leads of a of a flatpack chip. Adjacent these ends, recesses 42 and 44 are formed in the right and left sides respectively. This permits the resilient cantilever arms greater freedom of motion away from the center of the aperture. The arms may be withdrawn from a chip for loading and unloading the chip. Further, the extra space permits large chips to be loaded into the carrier. If the recesses are made sufficiently large, chips whose widths are as wide as the central aperture itself may be loaded into the carrier.

FIG. 2 shows a top plan view of the one piece carrier of the preferred embodiment. This figure shows essentially the same elements as shown in FIG. 1, and to the extent they were described in FIG. 1, they will not be descibed further here. Additional features not discussed in relation to FIG. 1 are stops 46 and 48 mounted on the interior of arms 30 and 32 respectively, facing the center of the central aperture. The stops provide lateral support for a chip when mounted in the carrier between arms 30 and 32. Due to the fact that the arms project from opposite walls, these stops are longitudinally offset from one another. Thus, should a chip be of insufficient length for it to rest on stops 26 and 28 mounted on the top and bottom sides of the central aperture, the offset itself will provide not only lateral, but also longitudinal support. This feature is important in that several assembly steps take place while the chip remains in the carrier. One such step is the stamping of identification material on the body of the chip. Without such longitudinal support, the chip would wobble in the carrier, bending the leads to an impermissible extent.

Also show in FIG. 2 are steps 50 and 52 extending from the left and right sides of the central aperture respectively a short, predetermined distance sufficient to accommodate the leads of a chip after they have been formed. Typically, the chip, before final assembly to circuit board, is removed from the carrier and the leads are formed and tinned. The forming process bends the leads down a short distance and cuts them off. Thus steps 50 and 52 are of lower elevation than rest of the body portion between the channels 12 to accommodate the bent leads. The length of the steps are such as to accommodate the trimmed leads.

FIG. 3 shows one of the tapered heads, 38. The heads are mounted on the ends of the arms and extend upwards to the top of the channels 12. Each head has an inwardly facing tapered edge 54, whose wide portion comprises the top of the head and whose narrow portion cmprises the bottom of the head, which is mounted on the arm. The head in the preferred embodiment is formed as a one piece unit with the cantilever arms.

The taper of the heads permits the loading of chips of varying thicknesses into the one piece carrier. The heads are designed to be taller than the thickest chip to be mounted in the carrier. Thus, when mounted, the chip spreads the resilient cantilevered arms apart and contact the heads along their tapered edges 54. The tapered edge of the heads tends to force the chip down into chip against the stops 46 and 48, and if the chip is long enough, stops 26 and 28.

FIG. 4 shows a detail of a portion of arm 32 and head 40 of FIG. 2. Near the end of each arm, the arm is bent inwardly by a small angle, which in the preferred embodiment is 6 degrees 18 minutes. This is the same angle by which the resilient arms are spread away from the center of the central aperture by a chip mounted therein, when the chip is of a "standard" thickness. This permits the face of the tapered edge to contact the chip flat. The angle of the preferred embodiment may of course be varied as necessary by those skilled in the art to accomplish the same purpose.

FIG. 5 is a cross-sectional view along 5—5 of FIG. 2. The view shows the walls 13 of the channels 12, which as aforementioned, provide support for the leads of the flatpack chip. Cuts 56 and 58 in two of these wall mark the edges of recess 42, which extends from the body portion 10 to the top of the channel walls 13. Step 52 is also shown as a lower elevational between channel walls 13. Stops 26 and 28 are also shown. The tops 60 of these stops are even with the top 62 of the body portion 10 between channels 12.

The Figure also shows cantilever arm 30, head 38 with facing tapered edge 54 and stop 46 mounted on the interior of arm 30 facing the center of the central aperture 14. The top 64 of this stop is even with the top of the stops 26, 28 and 48, and is also even with the top of the body portion of the chip carrier between channels 12. The stop also extends a short distance above arm 30. This permits the pins of an automatic assembly device to enter the chip carrier from below, contact the cantilever arm, and push it away from the center of the central aperture without interference from a flatpack chip sitting atop stop 46.

Figure 6:
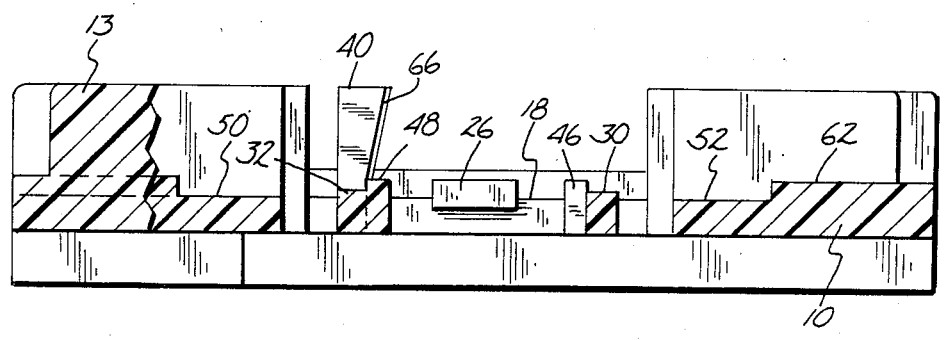
FIG. 6 is a cross-sectional view along 6—6 of FIG. 2.

This feature is also shown in FIG. 6, a cross-sectional view along 6—6 of FIG. 2, wherein the height of stops 46 and 48 extends their tops above arms 30 and 32. Stop 26 is also shown. Shown also in the figure is head 40 mounted on the end of arm 32 with tapered edge 66 facing inwards toward the center of central aperture 14. The primary feature shown in this Figure are steps 50 and 52 which are lower elevational areas formed in the body portion 10 of the carrier. The steps extend a short distance form the left and right sides of the central aperture, the distance being sufficient to accommodate trimmed, bent, formed leads.

Figure 7:
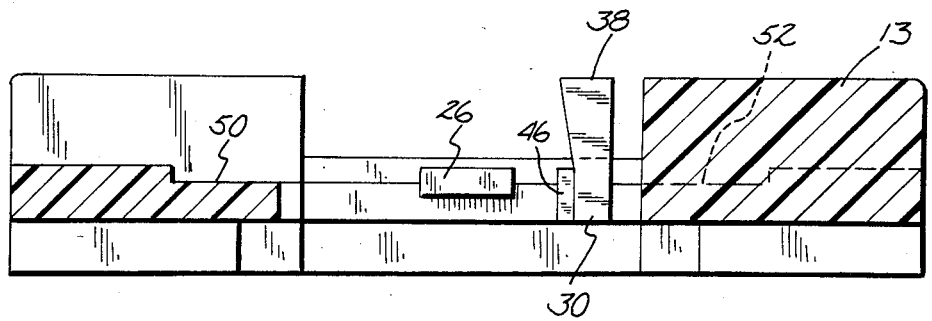
FIG. 7 is a cross-sectional view along 7—7 of FIG. 2.

Finally, FIG. 7 shows a cross-sectional view along 7—7 of FIG. 2. This Figure shows similar features as that of FIG. 6, but this time shows head 38 mounted on arm 30. Also shown are steps 50 and 52 as well a stop 26.

Figure 8:
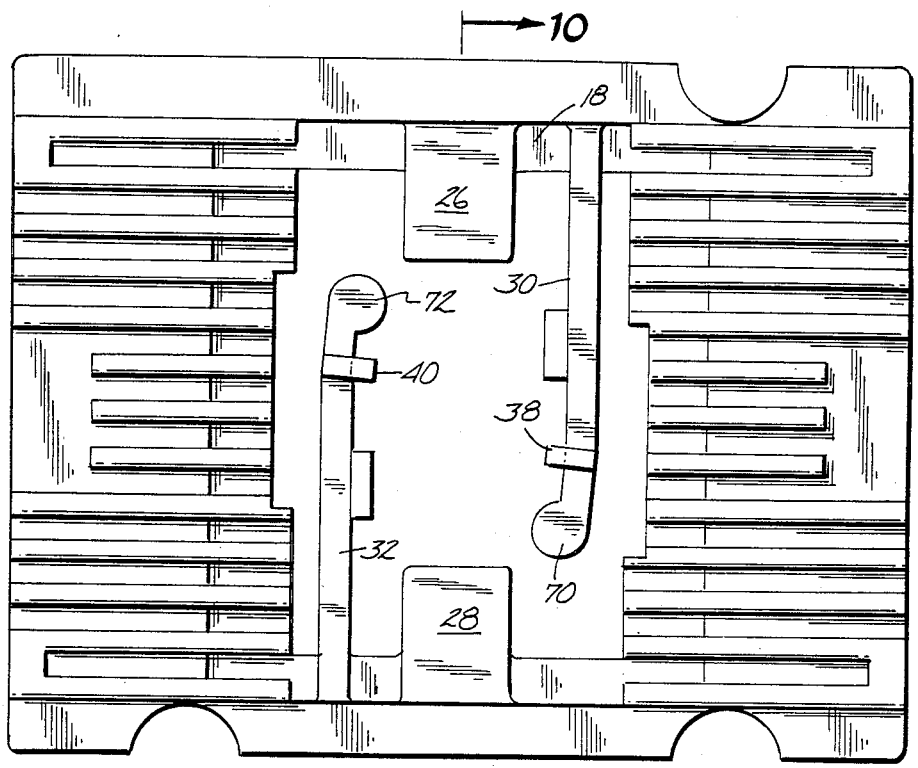
FIG. 8 is a top plan view of a second embodiment of the present invention wherein each cantilever arm has an extention thereof which acts as an auxilliary stop.
Figure 9:
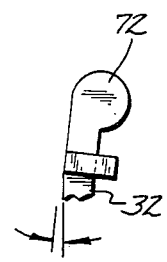
FIG. 9 is a detail of the head and extended stop of the alternative embodiment.
Figure 10:
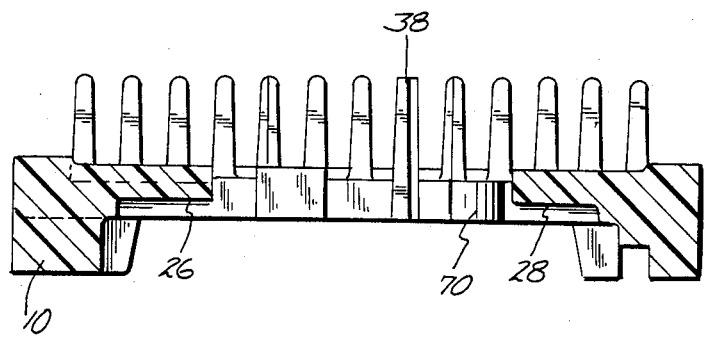
FIG. 10 is a cross-sectional view along 10—10 of FIG. 8.

This completes a discussion of the preferred embodiment. An alternative embodiment is shown in FIGS. 8 through 10 where the only additional feature is the addition of two forward stops 70 and 72 mounted on the ends of arms 30 and 32 respectively. The forward stops are angled into the center of the aperture as can be seen from FIG. 9 and are of the same height as the arms, as can be seen from FIG. 10. Because these forward stops are lower than stops 26 and 28, they normally will not contact a chip. However, when a chip is insufficiently long to contact the stops 26 and 28, these stops act an auxillially longitudinal support mechanisms to limit the degree of wobble when a chip is placed under pressure, such as when it is stamped.

The specifcation of the elements of the preferred embodiments should not be taken as a limitation on the scope of the appended claims, wherein

I claim:

1. In a one piece flatpack chip carrier having a body portion having a central aperture, the central aperture having top, bottom and left and right sides, said body portion further having mounted thereon opposed channels extending from said left and right central aperture sides for retaining a flatpack chip's leads extending from a body, and means for releasably retaining a flatpack chip in said carrier, an improved flatpack chip carrier comprising:

said means for releasably retaining a flatpack chip in said carrier comprising:

a pair of resilient cantilever arms having two ends, a first end of a first of said pair mounted on said top central aperture side and spaced from the center of said side in a first direction, a first end of a second of said pair mounted on said central aperture bottom side and spaced from the center of said side in a second direction equal and opposite to said first direction, each arm extending into said central aperture a predetermined distance; and a tapered head mounted on the second end of each of said cantilevered arms, each head having a tapered edge facing towards the center of the central aperture, the narrow end of the head mounted on the second end of the cantilever arm, the tapered edge of the head extending higher than the top of a flatpack chip body mounted in the one piece carrier;

the spacing between the resilient cantilevered arms and the degree of tapering of said heads combining to resiliently and releasably hold flatpack chips of varying body widths between the tapered edges of the respective edges.

2. The improved one piece carrier of claim 1 wherein the length of each of said cantilever arms is such that the arms extend past the centerline between the center of the left and right sides of the central aperture from opposite directions, the tapered heads thereby being spaced equal and opposite distances from said centerline.

3. The improved one piece carrier of claim 1 further including a stop mounted on the each of the top and bottom sides of said central aperture, and wherein said cantilever arms each includes a stop mounted on said arm between the two ends of the arm, the cantilever stops extending towards the center of said aperture, the stops providing lateral support for a flatpack chip and further preventing a flatpack chip from falling through said aperture if its length is insufficient for the chip to contact the stops mounted on the top and bottom sides of the central aperture.

4. The improved one piece carrier of claim 1 further including a step for accommodating the formed leads of a flatpack chip comprising a lower elevation formed in the body portion of the one piece carrier between said channels and extending from the left and right sides of the central aperture to a short predetermined distance away from the left and right sides of the central aperture, whereby the lower elevation of the step accommodates bent, formed leads of a flatpack chip and the higher elevation of the body portion after said predetermined distance accommodates unformed leads of a flatpack chip.

5. The improved one piece carrier of claim 1 further including a recess formed in each of the left and right sides of said central aperture adjacent to the furthest extension of the cantilever arms nearest thereto, the recesses accommodating motion of the nearest cantilever arm away from the body of a flatpack chip to thereby assist in releasing the chip from the retention of the resilient cantilever arms, the depth of the recesses further adapted for mounting of flatpack chips of widths up to the width of the central aperture.

6. The improved one piece carrier of claim 3 wherein the four stops are further arranged to prevent a flatpack chip from extending below the top of the cantilever arms so that the flatpack does not interfere with release pins of a release mechanism from entering the central aperture from below the chip carrier, contacting the cantilever arms, and pushing them outwards to release the flatpack chip.

7. The improved one piece carrier of claim 1 further including a closing wall mounted on the ends furthest from the central aperture of the four outermost channels mounted on the body portion.

8. The improved one piece carrier of claim 3 wherein the two cantilever stops are spaced equal and opposite directions from said centerline extending between the left and right sides of the central aperture to give added stability in a second degree of freedom for a chip of a length insufficient for it to contact the stops mounted on the top and bottom sides of said central aperture, so that the chip may be processed and contacted without wobbling while mounted in the improved chip carrier.

9. The improved one piece carrier of claim 2 further including a stop mounted on the each of the top and bottom sides of said central aperture, and wherein said cantilever arms each includes a stop mounted on said arm between the two ends of the arm, the cantilever stops extending towards the center of said aperture, the stops providing lateral support for a flatpack chip and further preventing a flatpack chip from falling through said aperture if its length is insufficient for the chip to contact the stops mounted on the top and bottom sides of the central aperture.

10. The improved one piece carrier of claim 2 further including a step for accommodating the formed leads of a flatpack chip comprising a lower elevation formed in the body portion of the one piece carrier between said channels and extending from the left and right sides of the central aperture to a short predetermined distance away from the left and right sides of the central aperture, whereby the lower elevation of the step accommodates bent, formed leads of a flatpack chip and the higher elevation of the body portion after said predetermined distance accommodates unformed leads of a flatpack chip.

11. The improved one piece carrier of claim 3 further including a step for accommodating the formed leads of a flatpack chip comprising a lower elevation formed in the body portion of the one piece carrier between said channels and extending from the left and right sides of the central aperture to a short predetermined distance away from the left and right sides of the central aperture, whereby the lower elevation of the step accommodates bent, formed leads of a flatpack chip and the higher elevation of the body portion after said predetermined distance accommodates unformed leads of a flatpack chip.

12. The improved one piece carrier of claim 9 further including a step for accommodating the formed leads of a flatpack chip comprising a lower elevation formed in the body portion of the one piece carrier between said channels and extending from the left and right sides of the central aperture to a short predetermined distance away from the left and right sides of the central aperture, whereby the lower elevation of the step accommodates bent, formed leads of a flatpack chip and the higher elevation of the body portion after said predetermined distance accommodates unformed leads of a flatpack chip.

13. The improved one piece carrier of claim 9 wherein the two cantilever stops are spaced equal and opposite directions from said centerline extending between the left and right sides of the central aperture to give added stability in a second degree of freedom for a chip of a length insufficient for it to contact the stops mounted on the top and bottom sides of said central aperture, so that the chip may be processed and contacted without wobbling while mounted in the improved chip carrier.

14. The improved one piece carrier of claim 2 further including a recess formed in each of the left and right sides of said central aperture adjacent to the furthest extension of the cantilever arms nearest thereto, the recesses accommodating motion of the nearest cantilever arm away from the body of a flatpack chip to thereby assist in releasing the chip from the retention of the resilient cantilever arms, the depth of the recesses further adapted for mounting of flatpack chips of widths up to the width of the central aperture.

15. The improved one piece carrier of claim 3 further including a recess formed in each of the left and right sides of said central aperture adjacent to the furthest extension of the cantilever arms nearest thereto, the recesses accommodating motion of the nearest cantilever arm away from the body of a flatpack chip to thereby assist in releasing the chip from the retention of the resilient cantilever arms, the depth of the recesses further adapted for mounting of flatpack chips of widths up to the width of the central aperture.

16. The improved one piece carrier of claim 4 further including a recess formed in each of the left and right sides of said central aperture adjacent to the furthest extension of the cantilever arms nearest thereto, the recesses accommodating motion of the nearest cantilever arm away from the body of a flatpack chip to thereby assist in releasing the chip from the retention of the resilient cantilever arms, the depth of the recesses further adapted for mounting of flatpack chips of widths up to the width of the central aperture.

17. The improved one piece carrier of claim 9 further including a recess formed in each of the left and right sides of said central aperture adjacent to the furthest extension of the cantilever arms nearest thereto, the recesses accommodating motion of the nearest cantilever arm away from the body of a flatpack chip to thereby assist in releasing the chip from the retention of the resilient cantilever arms, the depth of the recesses further adapted for mounting of flatpack chips of widths up to the width of the central aperture.

18. The improved one piece carrier of claim 17 wherein the two cantilever stops are spaced equal and opposite directions from said centerline extending between the left and right sides of the central aperture to give added stability in a second degree of freedom for a chip of a length insufficient for it to contact the stops mounted on the top and bottom sides of said central aperture, so that the chip may be processed and contacted without wobbling while mounted in the improved chip carrier.

19. The improved one piece carrier of claim 18 further including a step for accommodating the formed leads of a flatpack chip comprising a lower elevation formed in the body portion of the one piece carrier between said channels and extending from the left and right sides of the central aperture to a short predetermined distance away from the left and right sides of the central aperture, whereby the lower elevation of the step accommodates bent, formed leads of a flatpack chip and the higher elevation of the body portion after said predetermined distance accommodates unformed leads of a flatpack chip.

* * * * *